(12) United States Patent
Piasecki

(10) Patent No.: US 6,300,889 B1
(45) Date of Patent: Oct. 9, 2001

(54) SYSTEM ON CHIP WITH ADC HAVING SERIAL TEST MODE

(75) Inventor: Douglas Scott Piasecki, Austin, TX (US)

(73) Assignee: Cygnal Integrated Products, Inc., Austin, TX (US)

( * ) Notice: Subject to any disclaimer, the term of this patent is extended or adjusted under 35 U.S.C. 154(b) by 0 days.

(21) Appl. No.: 09/596,458

(22) Filed: Jun. 19, 2000

(51) Int. Cl.[7] .................................................. H03M 1/00
(52) U.S. Cl. ..................... 341/122; 341/118; 341/120; 341/143; 341/144; 341/155; 341/172; 341/110
(58) Field of Search .................................. 341/155, 122, 341/110, 143, 120, 118, 119, 172, 144

(56) References Cited

U.S. PATENT DOCUMENTS

| 5,640,161 | * | 6/1997 | Johnson et al. ....................... 341/122 |
| 5,706,004 | * | 1/1998 | Yeung ................................... 341/122 |
| 6,091,349 | * | 7/2000 | Chadha et al. ......................... 341/118 |
| 6,232,905 | * | 5/2001 | Smith et al. ........................... 341/155 |

FOREIGN PATENT DOCUMENTS

| 1-50670-A | * | 2/1989 | (JP) . |
| 1-58044-A | * | 3/1989 | (JP) . |
| 1-58043-A | * | 6/1989 | (JP) . |
| 1-233832-A | * | 9/1989 | (JP) . |
| 5-143187-A | * | 6/1993 | (JP) . |

* cited by examiner

Primary Examiner—Michael Tokar
Assistant Examiner—Lam T. Mai
(74) Attorney, Agent, or Firm—Howison, Chauza, Thoma, Handley & Arnott, L.L.P.

(57) ABSTRACT

A system on chip with ADC having serial test mode. An integrated circuit having a processing system with a system clock and a data conversion circuit is provided that is operable to convert data between the analog and the digital domain, the data converter utilizing the system clock during normal operation. A clock isolation circuit is provided for isolating the operation of the data converter from the system clock during a test mode. A serial clock is provided for generating a serial clock during the test mode independent of a system clock. Control circuitry is then operable for controlling the data converter during the test mode to convert data utilizing the serial clock at times not coinciding with the rising and falling edges of the system clock, such control circuit operating in response to receiving a test control signal.

26 Claims, 6 Drawing Sheets

SYSTEM ON CHIP WITH ADC HAVING SERIAL TEST MODE

TECHNICAL FIELD OF THE INVENTION

This invention pertains in general to A/D converters and, more particularly, to an analog-to-digital converter implemented in an integrated chip having a processing function associated therewith.

BACKGROUND OF THE INVENTION

Integrated circuits that incorporate processors and the such typically include some type of data conversion function. This data conversion function can either be in the form of an analog-to-digital converter or a digital-to-analog converter. In the case of the analog-to-digital converter (ADC), analog data is received on an input, sampled and the sample converted to a digital value. Each sample of the analog input signal that is converted is performed during a "conversion" cycle.

One type of ADC that is typically implemented in a processor-based system (these processor-based systems are typically referred to as a "system on a chip") is a successive approximation converter. In the successive approximation converter, a digital-to-analog converter (DAC) is utilized to take a predefined sample output digital word and covert it to an analog value and then compare the generated analog value with the externally generated input voltage level. Each bit of the output digital word in the DAC has associated therewith a capacitor, which capacitors are binary weighted; that is, for the MSB, the capacitor is at a first value and for the next and successive bit, the capacitor is one-half that value, such that each successive bit halves the value of the previous capacitor value, the smallest being, associated with the LSB. The value of the output digital word is continually chanced to determine which combination of capacitors will result in a analog value output from the DAC substantially equal to the level of the input voltage.

One problem with ADCs when utilized in conjunction with significantly larger processing circuits is the sharing of a common clock. This can result in noise problems due to the fact that most sampling operations or conversion operations are initiated at a clock's edge. The noise that occurs at a clock's edge is due to various other processes or logic operations that are triggered from this edge. When dealing with small values of the capacitance, this noise can affect the actual analog output of the DAC that is embedded within the ADC.

SUMMARY OF THE INVENTION

The present invention disclosed and claimed herein, in one aspect thereof, comprises an integrated circuit having a processing system with a system clock and a data conversion circuit that is operable to convert data between the analog and the digital domain, the data converter utilizing the system clock during normal operation. A clock isolation circuit is provided for isolating the operation of the data converter from the system clock during a test mode. A serial clock is provided for generating a serial clock during the test mode independent of a system clock. Control circuitry is then operable for controlling the data converter during the test mode to convert data utilizing the serial clock at times not coinciding with the rising and falling edges of the system clock, such control circuit operating in response to receiving a test control signal.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
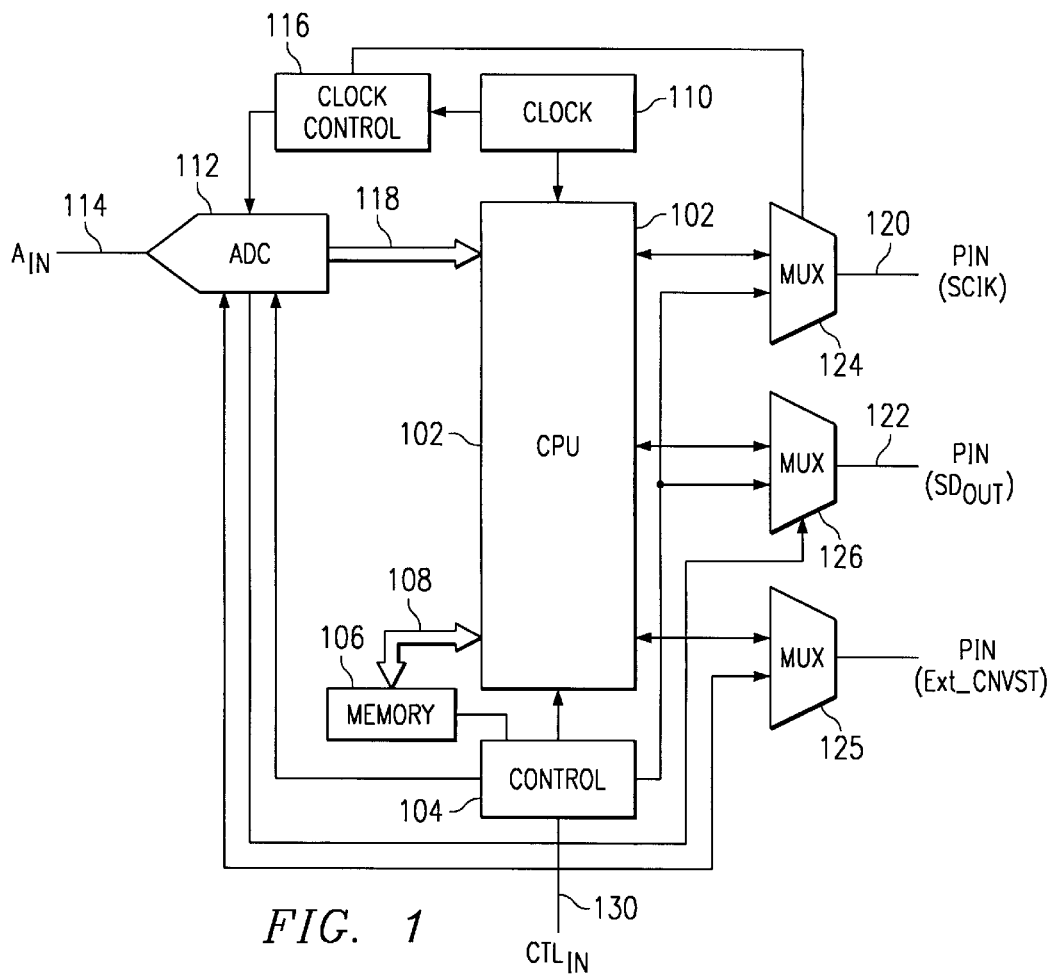
FIG. 1 illustrates a general block diagram of the ADC utilized in conjunction with processing circuitry.

Referring now to FIG. 1, there is illustrated a general block diagram of the overall system utilizing the analog-to-digital converter (ADC). There is provided a general system comprised of a central processing unit (CPU) 102 that constitutes the major processing portion of the integrated circuit. This would typically be associated with integrated circuits that are referred to as "system on a chip" integrated circuits. The CPU 102 interfaces with control circuitry 104 and a memory 106. The memory 106, in the disclosed embodiment, is a flash memory. The memory 106 interfaces with the CPU 102 through a bus 108 and the control circuitry 104 interfaces with both the CPU 102 and the memory 106. There is also provided a system clock 110, which can be any type of clock, preferably a crystal controlled clock. This, of course, will require an external crystal. The clock 110 provides the various clocking functions in the form of timing pulses and the such for the operation of the CPU 102 and the control circuit 104.

In addition to the general circuitry in the form of the memory 106 and the control circuitry 104, there is also provided a data converter circuit in the form of an analog-to-digital converter (ADC) 112 which allows the CPU 102 to interface with an analog input voltage on a line 114. This provides the CPU 102 with functionality interfacing with the analog domain, while it operates in the digital domain. The ADC 112 is operable to interface with the control circuitry 104 and also with the clock 110 and through a clock control circuit 116. Typically, the ADC 112 will convert a sample on the analog input in accordance with a control signal provided by the control circuit 104 and in association with clocking signals. This will provide a digital value output on a bus 118 for input to a CPU 102, this being a twelve-bit word in the disclosed embodiment.

The CPU 102 also interfaces with external pins for receiving information therefrom and transmitting information thereto. There are illustrated two input pins 120 and 122. There is provided a multiplexer 124 on the input pin 120 for interfacing the pin 120 with the CPU 102 and for interfacing the pin 120 with the clock control circuit 116. As will be described hereinbelow, this is for providing a serial clock input (SClk) in a test mode. This test mode is selected by the control circuit 104 in response to user input information. Additionally, there is provided a multiplexer 126 between the pin 122 and the CPU 106 for allowing output data to be extracted from the ADC 112 in a serial format and output on the pin 122 to provide serial data out (SDout). There is also provided a pin 123 for allowing a conversion start signal to be input to the ADC 1 12, this also being multiplexed with a multiplexer 125.

In operation, there is provided a control input 130 for input to the control circuitry 104 to allow control information to be input thereto. These are in the form the JTag inputs input to the flash memory 106. One control command that can be loaded into the control circuitry 104 is a test mode command. When this command is present, the ADC 112 is operated in a serial mode such that it is isolated from the CPU 102 and the operation thereof. In this mode, a serial clock is externally generated and input to the ADC 112 for use during the conversion operation and serial data is output through the multiplexer 126 to the pin 122. This will be described in more detail hereinbelow.

Figure 2:
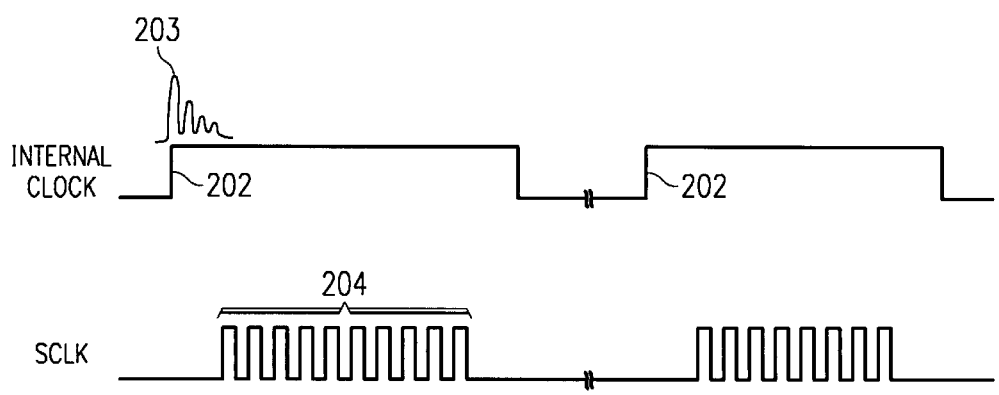
FIG. 2 illustrates a timing diagram illustrating the comparison of the internal clock and an external serial clock.

Referring now to FIG. 2, there is illustrated a timing diagram illustrating the test mode. The internal clock is represented as having a plurality of rising edges 202. Typically, whenever a rising edge occurs, there will be a number of logic circuits that will change states in the CPU and other circuitry associated with the overall Integrated Circuit, thus increasing the current draw through various lines and charging and discharging capacitive nodes. This results in noise 203 associated with that edge, which noise can be transmitted through the various power lines and can also be coupled through various capacitive coupling mechanisms to the ADC circuitry 112. The ADC circuitry 112 is a successive approximation ADC, a well-known data converter. These capacitors are selected by the bit value of the ADC output. For example, the MSB of the ADC 112 will have the largest value. The next step in the binary weighted search algorithm will have a value of "½" associated therewith. This will continue with the next one having a value of "¼," "⅛," etc. During the successive approximation algorithm, various combinations of the capacitors are selected by varying the digital values of the words, i.e., the "1's" and "0s" of the digital value on the output bus 118. Noise on the line can affect the analog value stored on the internal capacitors associated therewith (not shown) which can affect the accuracy of the data converter. When the ADC 112 is isolated, the clocking operation required for the data conversion can be restricted to regions outside of the rising edges 202. This is facilitated by operating the CPU 102, during the test mode, at its slowest speed and then increasing the frequency of the serial clock input to perform substantially the entire successive approximation operation between rising and falling edges of any one-half cycle of the internal clock. This is represented by a series of serial clock pulses 204 on the serial clock input string. During a conversion cycle, twelve values for a twelve-bit word will be tested, thus requiring a minimum of twelve cycles. Of course, there will usually be more additional cycles for various delays in settling times.

Figure 3:
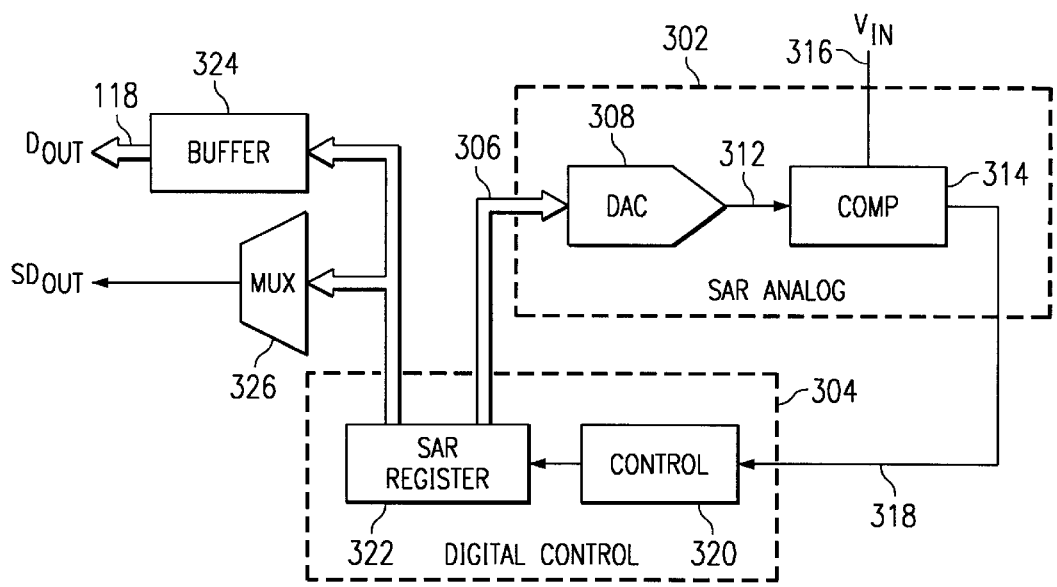
FIG. 3 illustrates a diagrammatic view of the ADC.

Referring now to FIG. 3, there is illustrated a diagrammatic view of the ADC 112. The ADC 112 can be divided into an analog section 302 and digital control section 304. The analog section is comprised of a DAC 308 which receives a digital value on a bus 306 which basically selects one of twelve SAR positions. This selection determines the analog output value on an analog output line 312. Although not illustrated, the DAC 308 utilizes a resistor combination described in U.S. patent application Ser. No. 09/419,148, filed Oct. 15, 1999, entitled A/D CONVERTER WITH VOLTAGE/CHARGE SCALING, which is incorporated herein by reference. The analog output line 312 is input to one input of a comparator 314, the other input thereof connected to the analog input voltage on a line 316 labeled $V_{IN}$. The output of the comparator 314 comprises a one-bit output on a line 318. When the output of the DAC is above the analog voltage $V_{IN}$, then the output of the comparator will be a logic "high" and, when it is below the input voltage $V_{IN}$, it will be a logic "low."

The comparator output 318 is input to a control circuit 320 which is operable to determine the bits on the bus 306. These bits are stored in a SAR register 322. The operation of this control circuitry 320 will be described hereinbelow, although it is conventional. The output of the SAR register 322 is also provided as the output to the CPU 102 on the bus 118 and is stored in a buffer 324. This provides an output therefrom on the bus 118. The output of the SAR register 322 is also input to a multiplexer 326 which is operable to derive the serial data output, as will be described in more detail hereinbelow.

Figure 4:
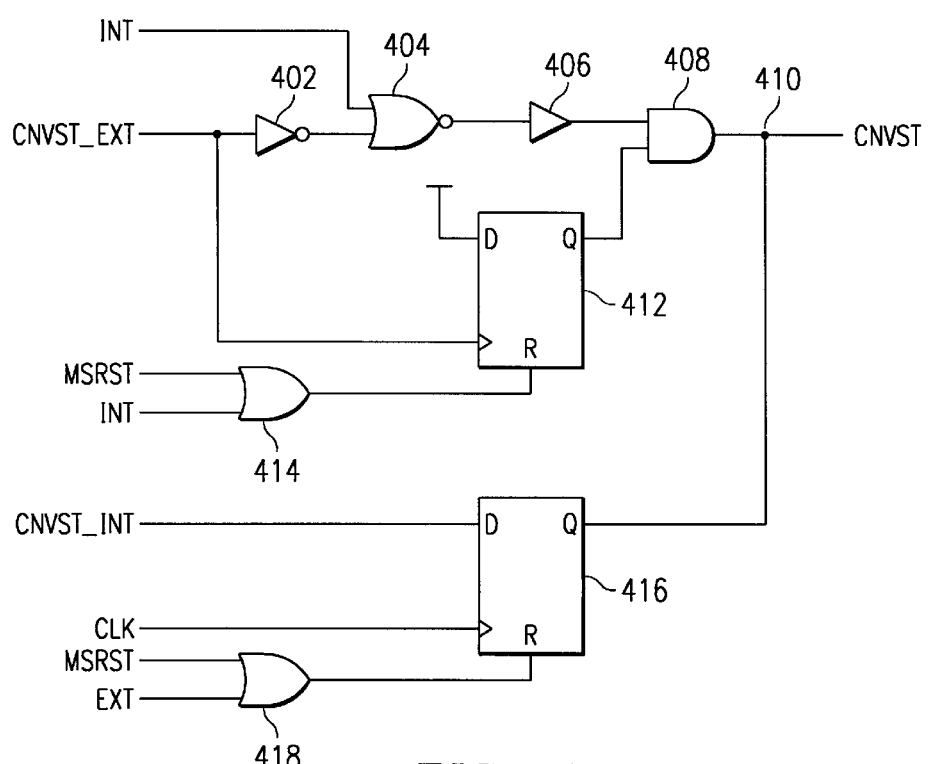
FIG. 4 illustrates a logic diagram for utilizing an external and internal conversion start signal.

Referring now to FIG. 4, there is illustrated a logic diagram for the operation of generating the conversion start signal CNVST. This conversion start signal can be generated in response to an external signal CNVST-EXT or an internal conversion start signal CNVST-INT. The internal conversion start signal is utilized during normal operation whereas the external signal can be selected by the user. The external conversion start signal is input through an inverter 402 to one input of a NOR gate 404, the other input thereof connected to an INT signal indicating that the operation is internally controlled. The output of gate 404 is connected through a delay driver 406 to one input of an AND gate 408. The output of the AND gate 408 comprises the convert start signal CNVST on a node 410. The other input of the AND gate 408 is connected to the Q-Output of a D-type flip flop 412. The data input thereof is connected to a positive supply node and the clock input thereof is connected to the external convert start signal CNVST-EXT. The reset input is connected to the output of an OR gate 414. One input thereof is connected to a signal INT and the other input thereof is connected to a master reset signal MSRST. Therefore, whenever the convert start signal is internal, the flip flop 412 will be reset and the gate 408 disabled. The internal convert start signal CNVST-INT is input to the D-Input of a D-type flip flop 416. The Q-Output of flip flop 416 is connected to the node 410 to provide the CNVST Output. The clock input of flip flop 416 is clocked by the system clock and the reset input thereof is connected to the output of an OR gate 418, one input thereof connected to the master reset signal and the other input thereof connected to the EXT signal. Basically the EXT signal is a signal that is generated indicating that an external convert start signal is to be utilized, the inverted form thereof being the INT signal. Therefore, the CNVST signal that is utilized to initiate the conversion operation can be created either externally or internally.

Figure 5:
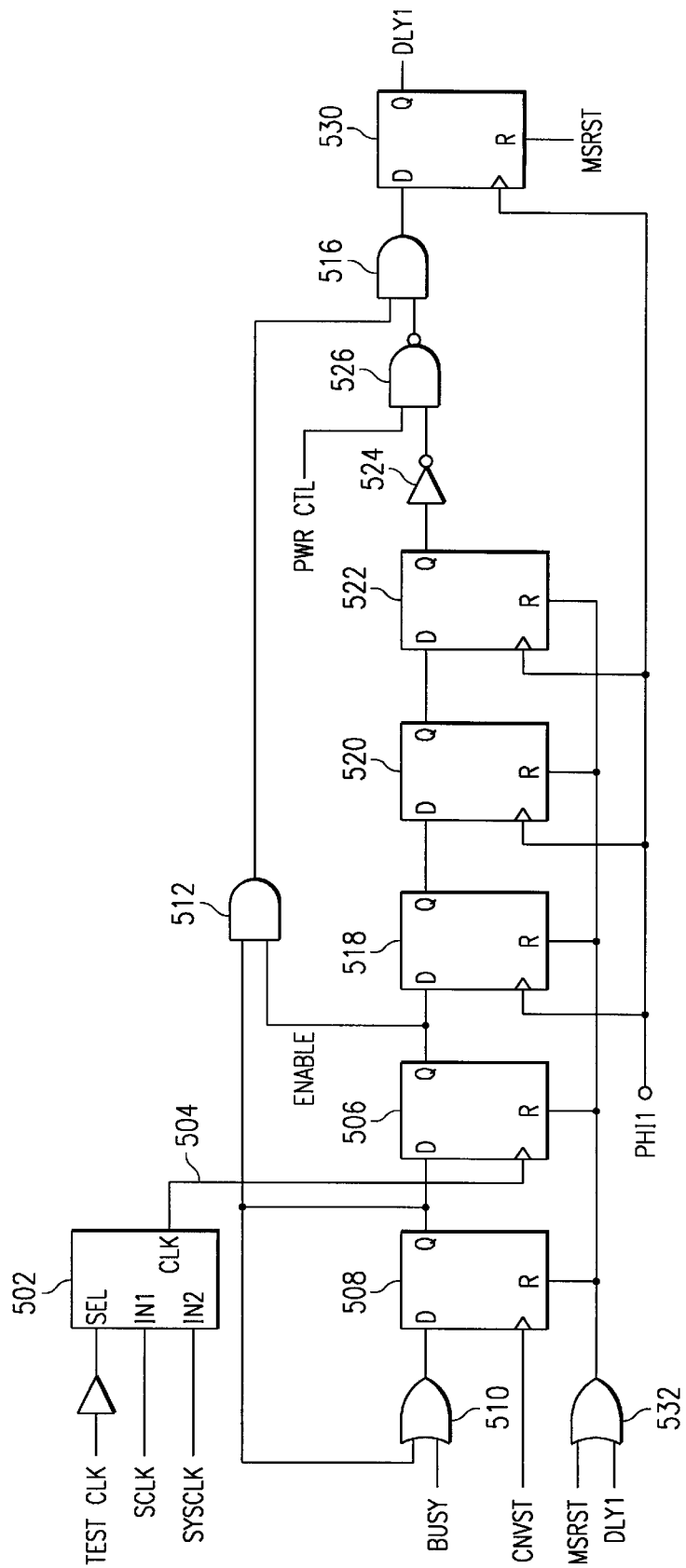
FIG. 5 illustrates a logic diagram for the successive approximation register (SAR)
Figure 6:
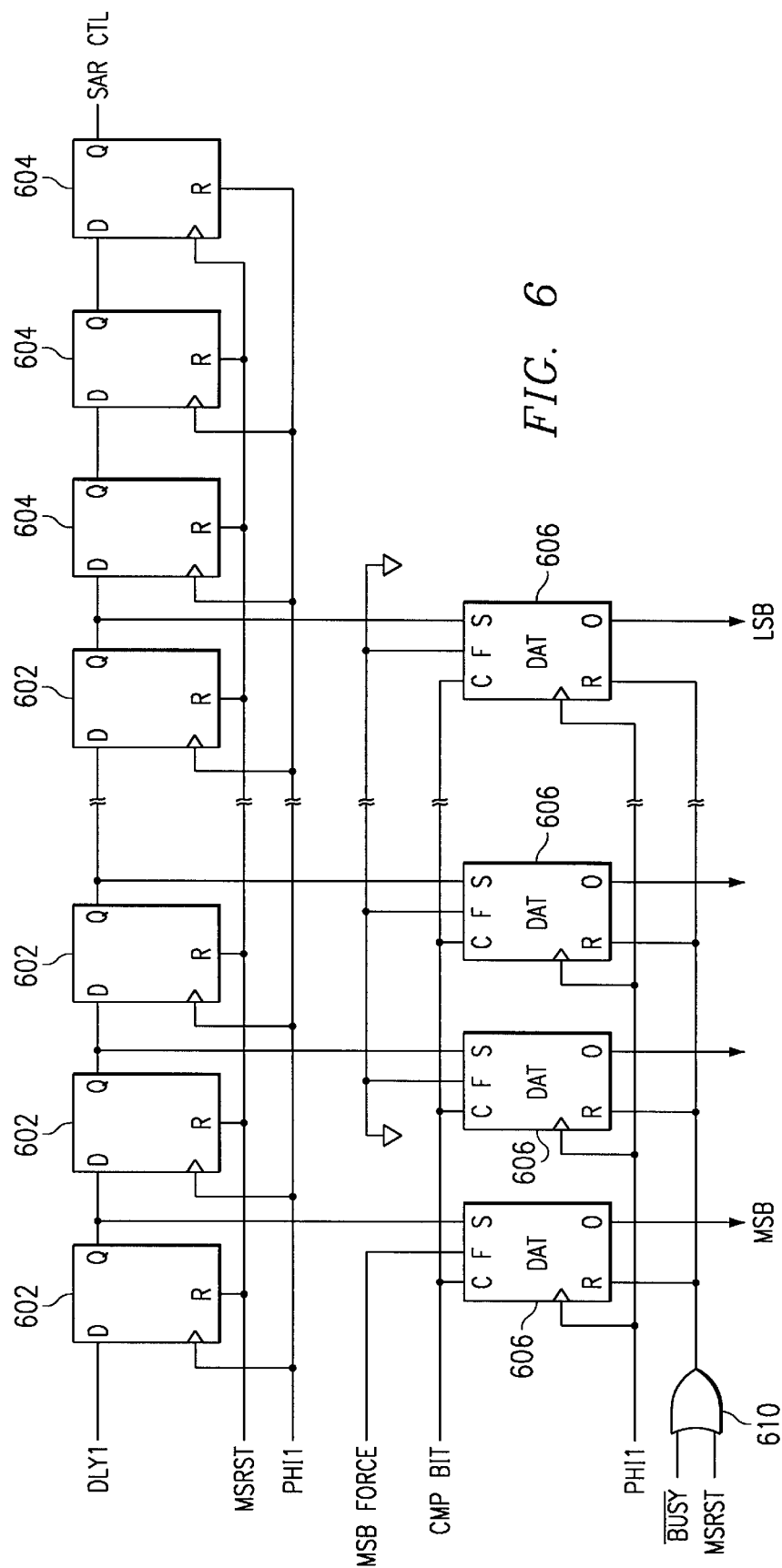
FIG. 6 illustrates a logic diagram for the SAR.

Referring now to FIGS. 5 and 6, there are illustrated logic diagrams of the control circuitry 320, the SAR register 322 and the multiplexer 326. With reference to FIG. 5, there is illustrated the portion of the logic diagram for generating a delay from the CNVST signal. A select block 502 is provided before determining whether the system clock or the serial clock is selected. A TestClk signal is input to the select input of the block 502 for selecting between the serial clock SCLK or the system clock SYSCLK signal for output on a CLK output 504. This is operable to clock a flip flop 506. A flip flop 508 provides the data input thereto from the Q-Output thereof. The D-Input is connected to the output of an OR gate 510, one input thereof connected to a BUSY signal and the other input connected to the Q-Output of flip flop 508. This QOutput is also connected to the input of flip flop 506 to provide the data input therefor and also is connected to one input of an AND gate 512. The other input of AND gate 512 is connected to the Q-Output of flip flop 506 and that constitutes the enable signal. The output of flip flop 512 provides an output whenever both the output of flip flop 508 is "high" and the output of flip flop is "high." Therefore, the CNVST signal must be present and the clock signal from either the serial clock or the system clock generates the clock signal 504 to clock through the logic "high" to the output of flip flop 506. This will cause the output of the AND gate 512 to go high. The output of AND gate 512 is connected to one input of an AND gate 516. The other input thereof is controlled by the phi 1 clock signal from the DAC 308 and ADC 112 (the controlling clock therefor) to enable the gate 516. The enable signal is only required whenever there is a PWRCTL signal for power control, another user selected function. When this signal is not present, then the gate 516 is also enabled. This is facilitated with a series grouping of flip flops 518, 520 and 522, flip flop 518 having the input thereof connected to the output of flip flop 506 and sequentially clocking through the output to an inverter 524 for input to one input of the NAND gate 526, the other input thereof connected to the PWRCTL signal. All of the flip flops 518-522 are clocked with phi 1 clock signal. The output of NAND gate 526 will be high unless both the PWRCTL signal is high and the output of flip flop 522 is low. If the PWRCTL signal is high, then the phi 1 signal will provide the enable signal three cycles delayed from the three cycles of the phi 1 cycle delayed from the CLK clock edge. However, when the PWRCTL signal is low, then the gate 516 will only be controlled by the output of AND gate 512. The output of gate 516 is input to the D-Input of flip flop 530, which is clock by the phi 1 signal. The flip flop 530 provides on the output thereof a delay signal DLY1 and is reset by the master reset signal MSRST. The flip flops 508, 506, 518, 520 and 522 are all reset by either the DLY 1 signal or the master reset signal with the use of an OR gate 532, the output thereof connects to the respective flip flops. With the circuitry of FIG. 5, the CNVST signal is synchronized with the clock edge of the serial clock or the system clock, depending upon which of the clocks is selected.

Referring now to FIG. 6, there is illustrated the remaining portion of the control circuitry and the SAR register 322. The DLY1 signal is input to a first flip flop 602 in a string of flip flops 602. The present disclosed embodiment utilizes a twelve-bit word and there are provided twelve flip flops 602 and three additional flip flops 604 for overflow, as will be described hereinbelow. The DLY1 signal is input to the D-Input of the first flip flop 602 and all the flip flops 602 and 604 are clocked by the phi 1 clock signal. All of the flip flops 602 and 604 are reset by the master reset signal MSRST. When the first flip flop 602 is clocked, the DLY1 signal being a "high" will be clocked through to the output thereof and, on the next phi 1 clock signal, this "high" will be clocked through to the output of flip flop 602. The DLY1 signal, as described hereinabove, will go "low" upon the next phi 1 signal. Therefore, there will be a "walking 1" that will be clocked through the flip flop 602 into the flip flop 604 to the output thereof. The output of the last flip flop 604 comprises the load control signal which, as will be described hereinbelow, is utilized to load the buffer 324 for interfacing the digital output of the SAR register 322 with the CPU 102.

The output of each of the flip flops 602 are provided as select inputs to a plurality of data latches labeled "DAT" 606, there being one DAT circuit 606 for each of the SAR output bits. Each of the DAT circuits has a select input for being associated with the respective flip flop 602 output and a compare bit (CMPBIT) input for receiving output of the comparator. There is provided an output an also a reset input. The DAT circuit 606 is operable to test each bit by first setting the bit high and then latching it if the output of the comparator is low. Each of the DAT circuits 606 are reset by either the MSRST master reset signal or the BUSY-Bar signal, this facilitated through an OR gate 610. Additionally, the DAT circuit 606 associated with the MSB has an additional signal for forcing the MSB to a particular state. Therefore, each of the DAT circuits 606 has a force input, only the MSB associated DAT circuit 606 having provided an input, with the remaining ones having that input ground.

Figure 7:
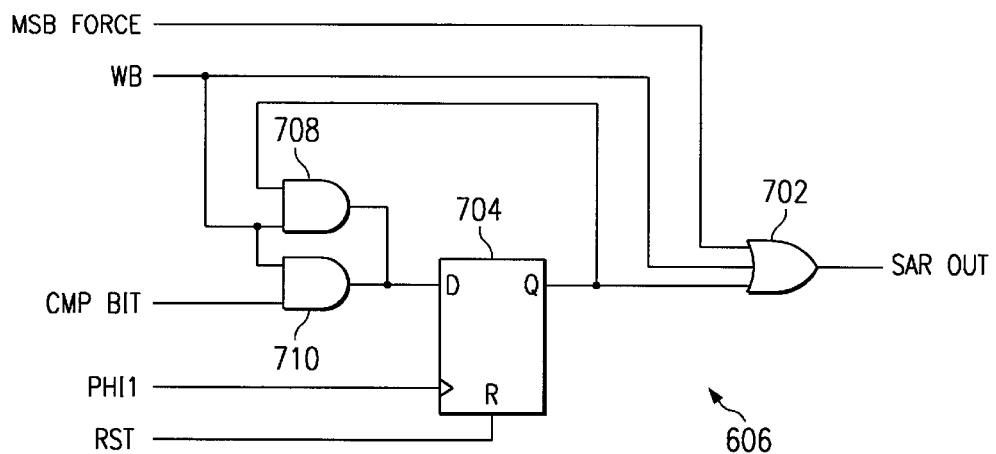
FIG. 7 illustrates a logic diagram for the output latch for each bit of the SAR.

Referring now to FIG. 7, there is illustrated a detailed logic diagram of the DAT circuit. The selected bit output by the flip flop 602 is referred to as a walking bit (WB). The WB select bit is input to one input of a three input OR gate 702. Another input thereof is the force bit for the MSB, only applicable to the first DAT circuit 606, and the third input provided by the output of the latch flip flop 704. The WB bit, when high, forces the associated output bit from the DAT to a logic "high" to select the capacitor for that bit. When this is selected, this will cause the DAC output to provide a correspondingly higher analog output, i.e., it will "step up." This is the test duration during which the comparator is testing the analog output to determine if it is in the acceptable range. If it is acceptable, the output of the comparator will be high; however, if it is too high, greater than the $V_{IN}$ voltage, then the comparator will go low. At the end of the test duration, the value of the bit will be latched in the flip flop 704 and then the next DAT 606 selected. The WB input, the select input, is input to one input of two AND gates 708 and 710. AND gate 708 has the output thereof connected to the D-Input of flip flop 704, the other input connected to the output of flip flop 704. The other AND gate 710 has the other input thereof connected to the CMPBIT signal, the output of the comparator, and the output thereof connected to the D-Input of flip flop 704. Flip flop 704 is clocked by the phi 1 clock signal. The master reset signal is operable to reset the flip flops 704.

In operation, whenever the phi 1 signal goes high, it will clock through the logic state on the data input to the output. The data input will be high whenever both of the select input, the WB bit, is high and either the comparator output bit is high or the output of flip flop 704 is high. Whenever the WB bit is high, this will cause the value of the compare bit to be passed through from the input to the output of the flip flop 704. Prior to the WB signal going low, as will be described hereinbelow, the comparator has completed testing the DAC output as compared to the analog input and this value is "latched" with the AND gate 708 prior to the WB input going low.

Figure 8:
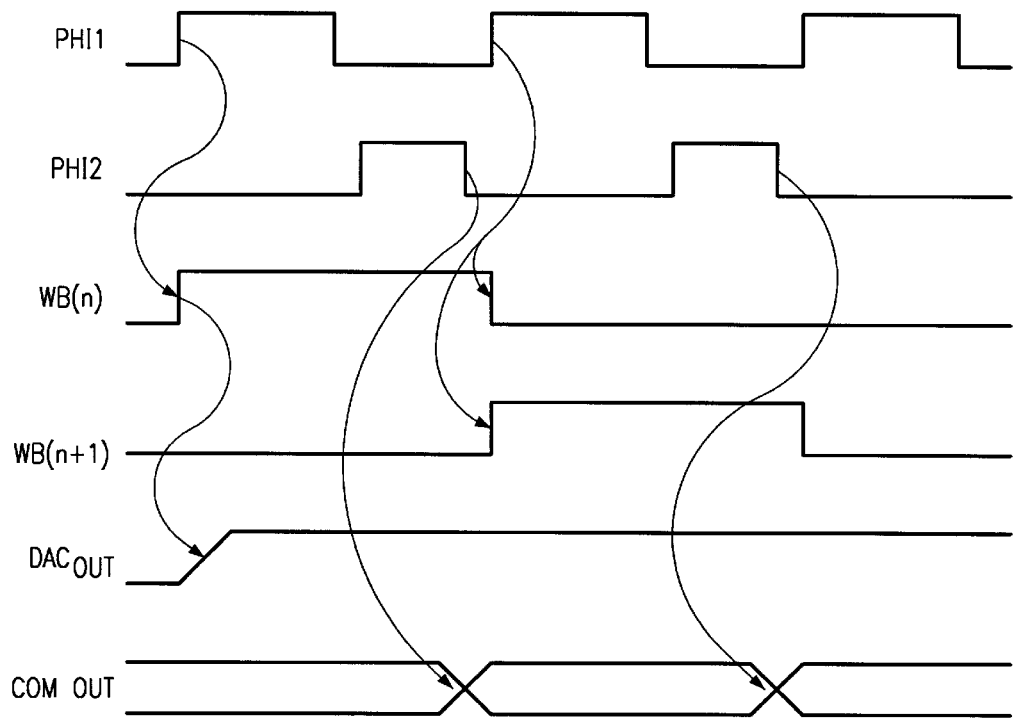
FIG. 8 illustrates a timing diagram for the generation operation for each bit of the SAR.

Referring now to FIG. 8, there is illustrated a timing diagram for the circuit of FIG. 7. There is provided the phi 1 clock signal and the phi 2 signal. The phi 2 signal is the inversion of the phi 1 signal, with the edges not overlapping. The rising edge of phi 1 causes the select bit WB to go high. Illustrated in FIG. 8 are two select bits WB(n) and WB(n+1). The first rising edge of phi 1 causes WB(n) to go high and the second rising edge causes the WB(n) signal to go low and the WB(n+1) to go high. Once selected, this will force selection of the capacitor and the output of the DAC will increase in value. The comparator, however, will not be tested until the falling edge of phi 2, which occurs before the next rising edge of phi 1. Therefore, the comparator output bit will be at the appropriate state to determine whether the selection of that capacitor should be maintained or not. Prior to the next phi 1 going high, this will be latched.

Figure 9:
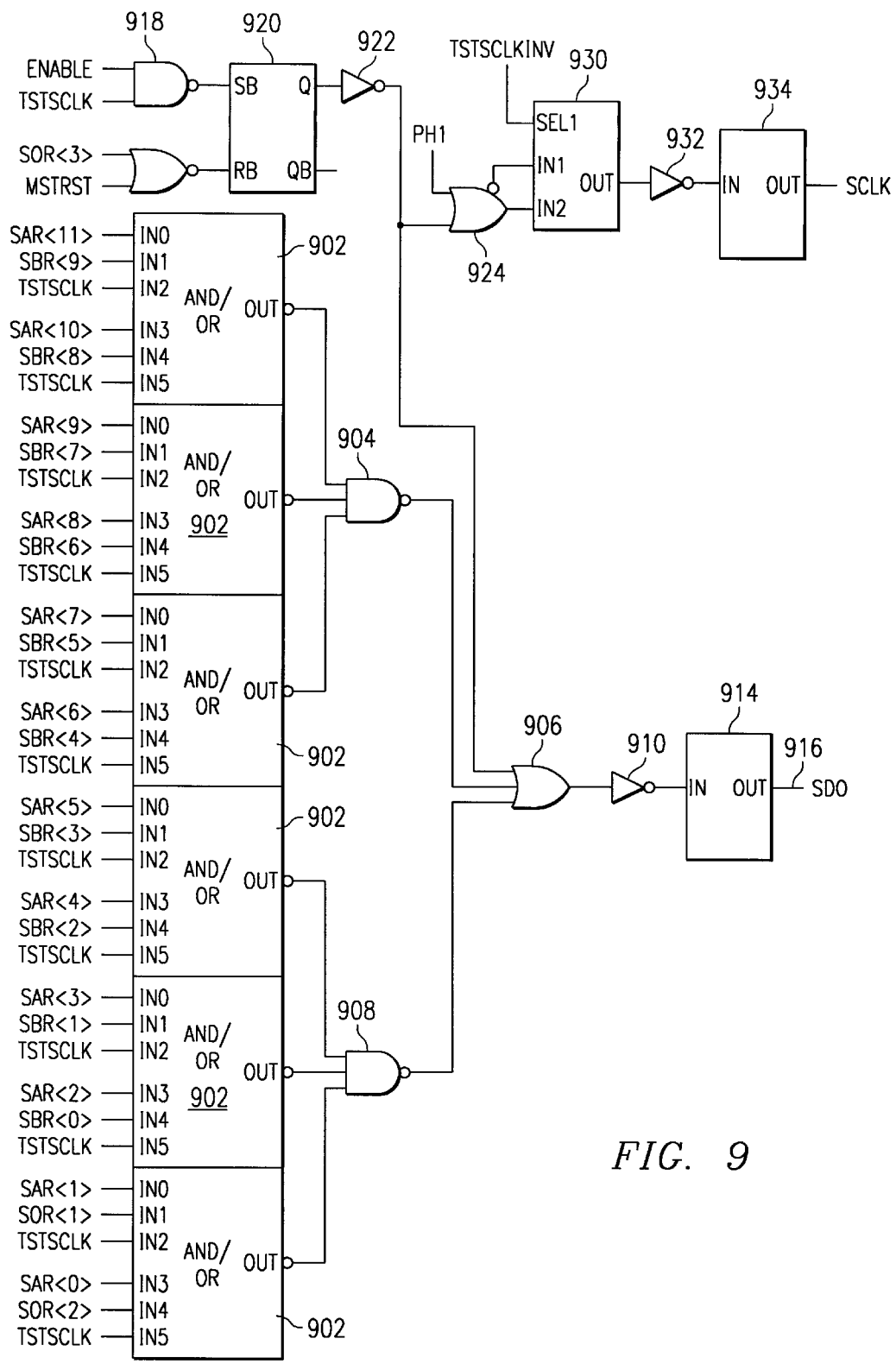
FIG. 9 illustrates a logic diagram for the SAR multiplexer and the serial clock control.

Referring now to FIG. 9, there is illustrated a logic diagram for the multiplexer operation of the multiplexer of 326. For each of the outputs from each of the DAT circuits 606, there is provided an AND gate in a complex logic AND/OR circuit 902. This is operable to provide the AND function for each of the SAR outputs and the select output or the walking bit (WB), which is referred to as "SBR." For bit 11, the walking bit for bit 9 is selected. The purpose for this is that a delay of two clock cycles is desirable to ensure that everything is settled out. The circuit 902 is operable to handle two adjacent bits with each bit ended with the walking bit and also the serial clock test signal "TSTSCLK." The output of this AND function is then ORed with the adjacent bit AND function and then the inverted form thereof provided as an output. Since there are twelve bits, there are six AND/OR circuits 902 to provide for all of these bits. For bits 1 and 0, the select bits from the register 604 are utilized.

The outputs of the first three AND/OR circuits 902 are input to one input each of a three-input NAND logic gate 904, the output thereof input to the input of a three-input OR gate 906. The remaining three AND/OR logic circuits 902 are output to respective inputs of the three-input NAND logic gate 908, the output thereof input to one input of the OR gate 906. The output of the OR gate 906 is passed through an inverter 910 to a driver 914 to provide the serial data output on a line 916. Therefore, as the walking bit sequentially increments from bit 9 through bit "−1," the output of each of the DAT circuits 606 will be selected and placed on the line 916.

The TSTSCLK signal and an enable signal are input to respective inputs of a NAND gate 918 to pull the set input of a set/reset register 920 to a low. Therefore, in the absence of either the enable or the TSTSCLK signal, the set input will be high. The output will go high when both the enable and the TSTSCLK signals are present. This enable signal on the Q-Output of the register 920 is passed through an inverter 922 to one input of an OR gate 924. The output of inverter 922 is also input to the other input of the OR gate 906. Therefore, whenever enabled, the output of inverter 922 will go "low" and, when not enabled, will go "high," resulting in a low on the line 916. Therefore, when the clock is not enabled, this will force the line 916 to a low state. This will also be the case with respect to any time an output bit from the SAR register is selected and it is in the test mode. Therefore, a "1" in one of the DATs 606 when selected, results in a "0" on the output.

The output of OR gate 924 is input to a one-of-two select circuit 930, which is operable to select either the inverted output or the non-inverted output of the OR gate 924. The other input of OR gate 924 is connected to the phi 1 clock. Therefore, when enabled, the output of select circuit 930 will be at the phi 1 signal, which is inverted by an inverter 932 and then provided as an output through a driver 934. The select circuit 930 is controlled by a serial clock test convert signal "TSTSCLKINV" the circuitry comprised of the OR gate 924, the select circuit line 930 and the driver 934 provides a separate output for the serial clock for test purposes. The phi 1 signal is generated off the serial clock.

In summary, there has been provided an integrated circuit having a processing circuit disposed thereon with a data conversion capability. This data conversion capability includes an analog-to-digital converter which operates on an internal clock during normal operation. In a test mode, the data converter is operable to be "isolated" from the processing circuit clock and a separate serial clock input thereto and serial data output therefrom. The system can be slowed down, such that the data converter is in operation for a single conversion cycle effected between rising and falling clock edges of the system clock.

Although the preferred embodiment has been described in detail, it should be understood that various changes, substitutions and alterations can be made therein without departing from the spirit and scope of the invention as defined by the appended claims.

What is claimed is:

1. An integrated circuit having a processing system with a system clock and a data conversion circuit that is operable to convert data between the analog and the digital domain, the data converter utilizing the system clock during normal operation, comprising:
   a clock isolation circuit for isolating the operation of the data converter from the system clock during a test mode;
   a serial clock for generating a serial clock during the test mode independent of a system clock; and
   control circuitry for controlling the data converter during the test mode to convert data utilizing the serial clock at times not coinciding with the rising and falling edges of the system clock, such control circuit operating in response to receiving a test control signal.

2. The integrated circuit of claim 1, wherein the data converter comprises an analog-to-digital converter for receiving on an analog input an analog signal and interfacing with the processing system to provide digital data therefrom during normal operation.

3. The integrated circuit of claim 2, wherein the output of said analog-to digital converter comprises a parallel digital word for output to said processing system during normal operation.

4. The integrated circuit of claim 1, wherein said serial clock is externally generated and further comprising an input/output pin for receiving said externally generated serial clock and interface circuitry for interfacing said externally generated serial clock with the data converter during the test mode of operation.

5. The integrated circuit of claim 4, and further comprising a multiplexer for multiplexing the operation of said input/output pin such that, during said test mode, said input/output pin comprises an input pin for receiving said externally generated serial clock and interfacing it with the data converter and, during normal operation, said input/output pin is configured to interface with the processing system as either an input or as an output.

6. The integrated circuit of claim 1, and further comprising conversion start circuitry for allowing independent initiation of the conversion cycle during said test mode.

7. The integrated circuit of claim 6, wherein said independently generated conversion start signal is externally generated and received on an input/output pin associated with the integrated circuit.

8. The integrated circuit of claim 1, wherein said control circuitry is operable to operate the data converter for a conversion cycle between rising and falling edges of the system clock such that an entire conversion cycle occurs between adjacent rising and falling edges of the system clock.

9. The integrated circuit of claim 8 wherein the processing system has the capability of having the operating speed thereof varied such that the system clock can be run at a lower frequency.

10. The integrated circuit of claim 1, wherein the conversion cycle during the test mode is controlled by said control circuit to be sufficiently removed from the rising and falling edges of the system clock.

11. The integrated circuit of claim 1 and further comprising a data isolation circuit for isolating the output of the data converter from the processing system during the test mode and an input/output pin associated with a serial data output for outputting the data from the data converter during the test mode.

12. The integrated circuit of claim 11, wherein the data output during the test mode is serial data and the data output during normal operation is parallel data.

13. The integrated circuit of claim 12, and further comprising a multiplexer for multiplexing the operation of said input/output pin such that, during the test mode, said input/output pin is operable to output serial data and, during normal operation, said input/output pin is operable to interface with the processing system to provide either an input thereto or to provide an output therefrom.

14. A method for processing data with a processing system with a system clock and a data conversion circuit that is operable to convert data between the analog and the digital domain, the data converter utilizing the system clock during normal operation, comprising the steps of:
   isolating with a clock isolation circuit the operation of the data converter from the system clock during a test mode;
   generating a serial clock during the test mode independent of a system clock; and
   controlling the data converter during the test mode to convert data utilizing the serial clock at times not coinciding with the rising and falling edges of the system clock, such control circuit operating in response to receiving a test control signal.

15. The method of claim 14, wherein the data converter comprises an analog-to-digital converter for receiving on an analog input an analog signal and interfacing with the processing system to provide digital data therefrom during normal operation.

16. The method of claim 15, wherein the output of the analog-to digital converter comprises a parallel digital word for output to the processing system during normal operation.

17. The method of claim 14, wherein the step of generating the serial clock comprises externally generating a serial clock and further comprising providing input/output pin for receiving the externally generated serial clock and interface circuitry for interfacing the externally generated serial clock with the data converter during the test mode of operation.

18. The method of claim 17, and further comprising the step of providing a multiplexer for multiplexing the operation of the input/output pin such that, during the test mode, the input/output pin comprises an input pin for receiving the externally generated serial clock and interfacing it with the data converter and, during normal operation, the input/output pin is configured to interface with the processing system as either an input or as an output.

19. The method of claim 14, and further comprising the step of allowing independent initiation of the conversion cycle during the test mode with conversion start circuitry.

20. The method of claim 19, wherein the independently generated conversion start signal is externally generated and received on an input/output pin.

21. The method of claim 14, wherein the step of controlling is operable to operate the data converter for a conversion cycle between rising and falling edges of the system clock such that an entire conversion cycle occurs between adjacent rising and falling edges of the system clock.

22. The method of claim 21 wherein the processing system has the capability of having the operating speed thereof varied such that the system clock can be run at a lower frequency.

23. The method of claim 14, wherein the conversion cycle during the test mode is controlled by the control circuit to be sufficiently removed from the rising and falling edges of the system clock.

24. The method of claim 14 and further comprising the step of isolating the output of the data converter from the processing system with a data isolation circuit during the test mode and providing an input/output pin associated with a serial data output for outputting the data from the data converter during the test mode.

25. The method of claim 24, wherein the data output during the test mode is serial data and the data output during normal operation is parallel data.

26. The method of claim 25, and further comprising the step of multiplexing with a multiplexer the operation of the input/output pin such that, during the test mode, the input/output pin is operable to output serial data and, during normal operation, the input/output pin is operable to interface with the processing system to provide either an input thereto or to provide an output therefrom.

* * * * *